United States Patent
Oh et al.

(10) Patent No.: US 6,751,824 B2
(45) Date of Patent: Jun. 22, 2004

(54) CLEANING APPARATUS FOR SEMICONDUCTOR WAFER

(75) Inventors: Jong-Woon Oh, Suwon (KR); Dong-Jun You, Yongin (KR); Ju-Sang Byun, Busan (KR); Seung-Hoon Kong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 262 days.

(21) Appl. No.: 09/851,089

(22) Filed: May 9, 2001

(65) Prior Publication Data

US 2002/0050015 A1 May 2, 2002

(30) Foreign Application Priority Data

Oct. 30, 2000 (KR) ......................................... 2000-63885

(51) Int. Cl.⁷ ........................... A47L 25/00; A47L 15/00
(52) U.S. Cl. ............................. 15/77; 15/88.4; 134/902
(58) Field of Search .......................... 15/77, 88.2, 88.3, 15/88.4, 103.5; 134/6, 902

(56) References Cited

U.S. PATENT DOCUMENTS

| | | | | |
|---|---|---|---|---|
| 5,829,087 A | * | 11/1998 | Nishimura et al. | 15/88.2 |
| 5,868,866 A | * | 2/1999 | Maekawa et al. | 134/34 |
| 6,286,525 B1 | * | 9/2001 | Nishimura et al. | 134/95.3 |
| 6,385,805 B2 | * | 5/2002 | Konishi et al. | 15/77 |

* cited by examiner

Primary Examiner—Robert J. Warden, Sr.
Assistant Examiner—Laura C Cole
(74) Attorney, Agent, or Firm—Volentine Francos, PLLC

(57) ABSTRACT

A wafer cleaning device is disclosed in which a brush is integrally formed with a nozzle for supplying pure water, such that a uniform water screen is formed on a surface of a wafer and particles on the wafer can be entirely removed. The cleaning device includes injectors for ejecting pure water supplied from a pure water supplier onto a wafer; nozzles disposed at one end of each of the injectors; and a brush for cleaning the wafer while moving horizontally between a center and edges of the wafer. The injectors include a first injector for ejecting pure water at an upper position of the wafer toward the center of the wafer, and a second injector disposed adjacent to the brush along one side of a brush arm, the brush arm supporting the brush and moving the brush and second injector toward the wafer.

15 Claims, 3 Drawing Sheets

CLEANING APPARATUS FOR SEMICONDUCTOR WAFER

This application relies for priority upon Korean Patent Application No. 2000-63885, filed on Oct. 3, 2000, the content of which is herein incorporated by reference in its entirety.

BACKGROUND OF THE INVENTION

1. Field of the Invention

The present invention relates to a cleaning apparatus for a semiconductor wafer. More particularly the present invention relates to a cleaning apparatus for a semiconductor wafer in which a spray nozzle is disposed near a brush, thereby allowing a uniform water screen to be formed on the surface of the wafer.

2. Description of the Related Art

Generally, as a wafer is enlarged, each of the devices on the wafer are formed at a higher density and the wafer becomes more highly integrated, whereby particles or metal impurities on the wafer pollute the wafer. This has the undesirable effect of deteriorating the yield and reliability of products made from the wafer. Accordingly, in order to remove various types of impurities such as particles, metal impurities, organic pollution, and surface film from the wafer surface, a separate wet cleaning process is performed after drying the wafer.

Such a conventional cleaning process is generally performed by a chemical cleaning method using chemicals, or by a spin scrubber cleaning method using a physical force. Of these methods, the spin scrubber cleaning method is widely used to remove impurities from wafers.

The spin scrubber wafer cleaning method can be classified into a cleaning method using pure water, a cleaning method using a brush, a cleaning method using ultrasonic waves, and so forth.

FIG. 1 is a schematic view showing a spin scrubber cleaning apparatus for a semiconductor wafer using pure water and a brush. As shown in FIG. 1, the spin scrubber cleaning apparatus includes a pure water supply 1, a filter 2, a solenoid valve 3, an injector 4, and a brush 6. The injector 4 has its output split into a first injector output 4a and second injector output 4b. The first injector output 4a has a first injector nozzle 5a attached to it, and the second injector output 4b has a second injector nozzle 5b attached to it.

Pure water supplied from the pure water supply 1 is further purified by passing through the filter 2 and continues through the solenoid valve 3 and injector 4, the first and second injector outputs 4a and 4b, and the first and second injector nozzles 5a and 5b. Ultimately, the pure water is ejected onto the wafer 7, which has a specified wafer pattern formed thereon, to form a water screen pattern on the wafer 7. Particles on the wafer 7 are then physically removed using the brush 6. The cleaning method of using a spin scrubbing apparatus is called a spin scrubber process.

During this process, pure water is usually supplied to the wafer 7 through the first and second injector nozzles 5a and 5b. The first injector output 4a is positioned toward the center of the wafer 7, and the second injector output 4b is positioned toward the central portion between the center and edge of the wafer 7. These two injectors 4a and 4b eject pure water onto the surface of the wafer 7 through respective nozzles 5a and 5b when the wafer rotates, so that a water screen is formed on the surface of the wafer. Particles on the wafer 7 are physically removed by the brush 6 when the wafer 7 rotates, while the water screen is formed on the wafer 7. During this process, the brush 6 is either in contact with the surface of the wafer 7 or is spaced from the wafer by interval of 0.5 $\mu$m, for example.

However, the water screen formed on the wafer can become irregular due to variations in the position and the ejecting pressure of the injector nozzles 5a and 5b. Accordingly, contact between the brush 6 and the wafer 7 can become unstable. As a result, the surface of the wafer can become damaged partly by excessive contact force between the brush 6 and the wafer 7. Alternatively, the particles might only be partly removed because of lack of contact between the wafer 7 and the brush 6, thereby deteriorating the product and its reliability in process.

SUMMARY OF THE INVENTION

The present invention is therefore directed to a cleaning apparatus for a semiconductor wafer which substantially overcomes one or more of the problems due to the limitations and disadvantages of the related art.

It is an object of the present invention to provide a wafer cleaning device in which a brush is integrally formed with a nozzle that supplies pure water, to form a uniform water screen on the surface of a wafer, so that particles on the wafer can be entirely removed.

It is another object of the present invention to provide a wafer cleaning device by which contact between a brush and a wafer is uniformly maintained, thereby raising the efficiency of semiconductor cleaning.

In order to accomplish these and other objects, a cleaning device according to the present invention comprises a pure water supply; first and second injectors for ejecting pure water supplied from the pure water supply onto a wafer; first and second nozzles attached to ends of the respective first and second injectors; a brush for cleaning the wafer by moving horizontally between the center to the edge of the wafer; and a brush arm for supporting and moving the brush. The first injector ejects the pure water at an upper position of the wafer toward the center wafer, and the second injector is disposed adjacent to the brush along one side of a brush arm, and supplies the pure water toward the wafer.

The second nozzle may be disposed such that it faces a top surface of the wafer that is in contact with the brush. The first injector may be arranged to be perpendicular to the second injector. The brush may move horizontally in response to the direction of the first injector.

In an alternate design, a cleaning device is provided that comprises a pure water supply; a first injector for ejecting pure water supplied from the pure water supply onto a central portion of the wafer; a plurality of second injectors for ejecting pure water supplied from the pure water supply onto the wafer; a first nozzle attached to the first injector; a plurality of second nozzles attached to respective second injectors; a brush for cleaning the wafer by moving horizontally between the center and the edge of the wafer while the pure water is ejected by the first and second nozzles; and a brush arm for supporting and moving the brush. The plurality of second injectors comprise a plurality of pipe lines formed along a circumference of the brush arm, the end of the pipelines facing a top surface of the wafer.

The plurality of second injectors may be tightly fixed to the brush arm by a fixing apparatus. The first injector may be arranged to be perpendicular to the plurality of second injectors.

In these embodiments, the brush arm may move in a direction parallel to a linear orientation of the first injector.

The brush arm may also move vertically to either keep the brush a desired distance from a surface of the wafer, or to keep the brush in contact with the surface of the wafer.

BRIEF DESCRIPTION OF THE DRAWINGS

The foregoing and other objects, features and advantages of the invention will be apparent from the following more particular description of the preferred embodiments of the invention, as illustrated in the accompanying drawings. In these drawings, like reference characters refer to the same parts throughout the different views, and wherein.

DETAILED DESCRIPTION OF THE PREFERRED EMBODIMENTS

Preferred embodiments of the present invention will be explained in detail below with reference to the accompanying drawings.

Figure 1:
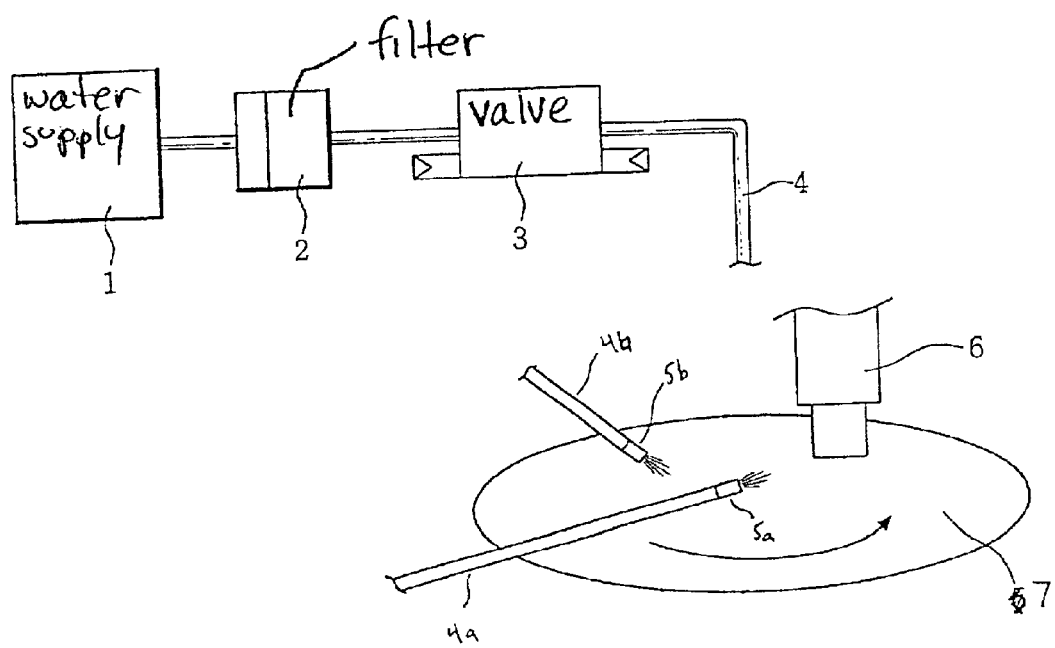
FIG. 1 is a schematic view showing a conventional wafer cleaning device.
Figure 2:
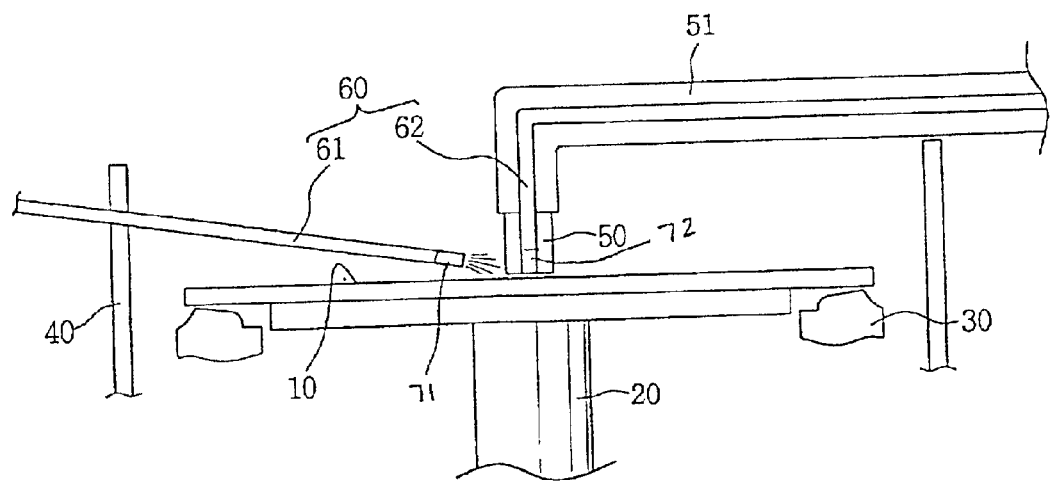
FIG. 2 is a cross sectional view of the cleaning device according to a first preferred embodiment of the present invention.
Figure 3:
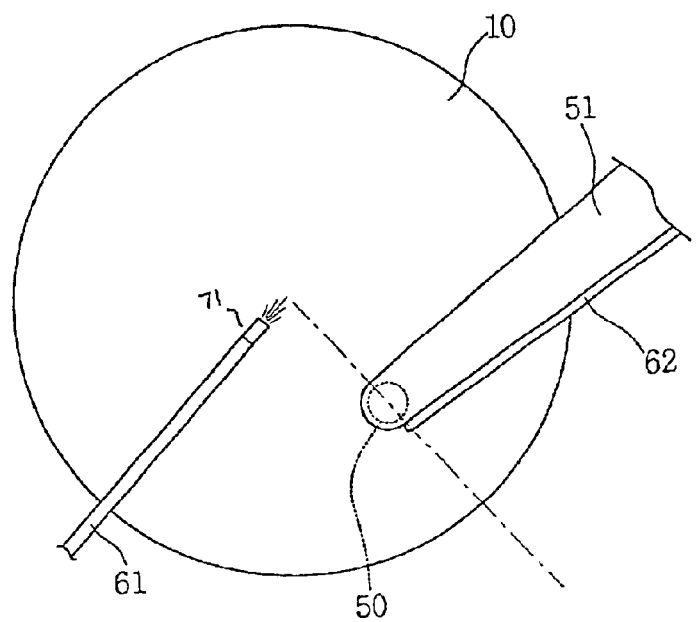
FIG. 3 is an overhead view showing the structure of the cleaning device at an upper position of the wafer according the first preferred embodiment of the present invention.

FIGS. 2 and 3 show cross-sectional and overhead views of a cleaning device according to a preferred embodiment of the present invention. This cleaning device includes a turntable 20, a draining guide 30, a wall 40, a brush 50, and an injector 60. The turntable 20 fixes a wafer 10 by adsorption of air, and is capable of rotating. The draining guide 30 is disposed below the circumference of the wafer 10 fixed on the turntable 20. The wall 40 surrounds the wafer 10 and prevents the pure water from being sprayed out of the draining guide 30. The brush 50 cleans the surface of the wafer 10 by scrubbing it. The injector 60 supplies pure water onto the wafer 10 during scrubbing by the brush 50, thereby forming a uniform water screen on the wafer 10. The injector in this embodiment includes a first injector 61 having a first nozzle 71, and a second injector 62 having a second nozzle 72.

In this structure, the brush 50 is rotatably supported by a brush arm 51, which may be moved horizontally and vertically. Accordingly, the brush 50 can move between the center and the edge of the wafer 10 based on the horizontal movement of the brush arm 51, and can remain in contact with, or at an appropriate distance from the surface of the wafer 10, based on the vertical movement of the brush arm 51.

Figure 4:
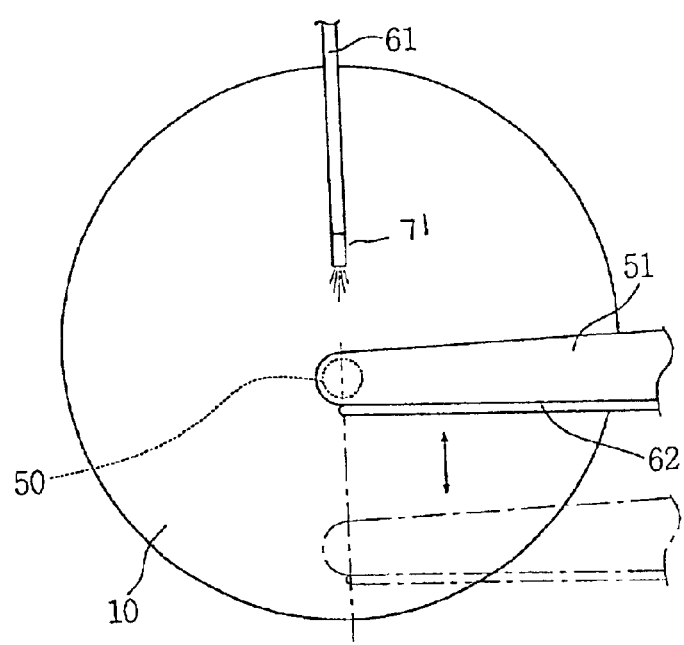
FIG. 4 is an overhead view showing by way of example the moving direction of the brush according to a second preferred embodiment of the invention.

In addition, the cleaning device of the preferred embodiment of the present invention improves the structure of the injector 60 for forming a water screen on the semiconductor wafer 10 as follows. As shown in FIGS. 3 and 4, the first injector 61 is disposed above one side of the wafer 10 and supplies pure water to the center portion of the wafer 10 through the first nozzle 71. The second injector 62 is disposed along the brush arm 51, which moves between the center portion and the edge portion of the wafer 10. The second injector 62 is preferably positioned adjacent to the brush 50 and extends from a position adjacent to the brush 50 along the circumference of the brush arm 51. The second nozzle 72 at the end of the second injector 62 is provided in the brush 50, parallel to the bristles and perpendicular to the surface of the wafer.

Pure water ejected through the first nozzle 71 of the first injector 61 prevents the wafer surface from being dried. Pure water ejected through the second nozzle 72 of the second injector 62 forms a water screen having a regular thickness over the wafer surface that is in contact with the brush 50 during scrubbing. During this process, the pressures of the pure water ejected through the first and second nozzles 71 and 72 of the first and second of the injectors 61 and 62 are appropriately controlled in response to the size and the rotational speed of the wafer 10.

FIGS. 3 and 4 show the orientation of the first and second injectors 61 and 62 in the first and second preferred embodiments. As show in FIG. 3, in the first preferred embodiment the first injector 61 is positioned in a direction parallel to the second injector 62 with reference to the central portion of the wafer 10. As shown in FIG. 4, in the second preferred embodiment, the first injector 61 is positioned perpendicular to the second injector 62 with reference to the central portion of the wafer 10. In the second preferred embodiment, it is preferable that the brush 50 moves horizontally in a direction parallel to the first injector 61.

Figure 5:
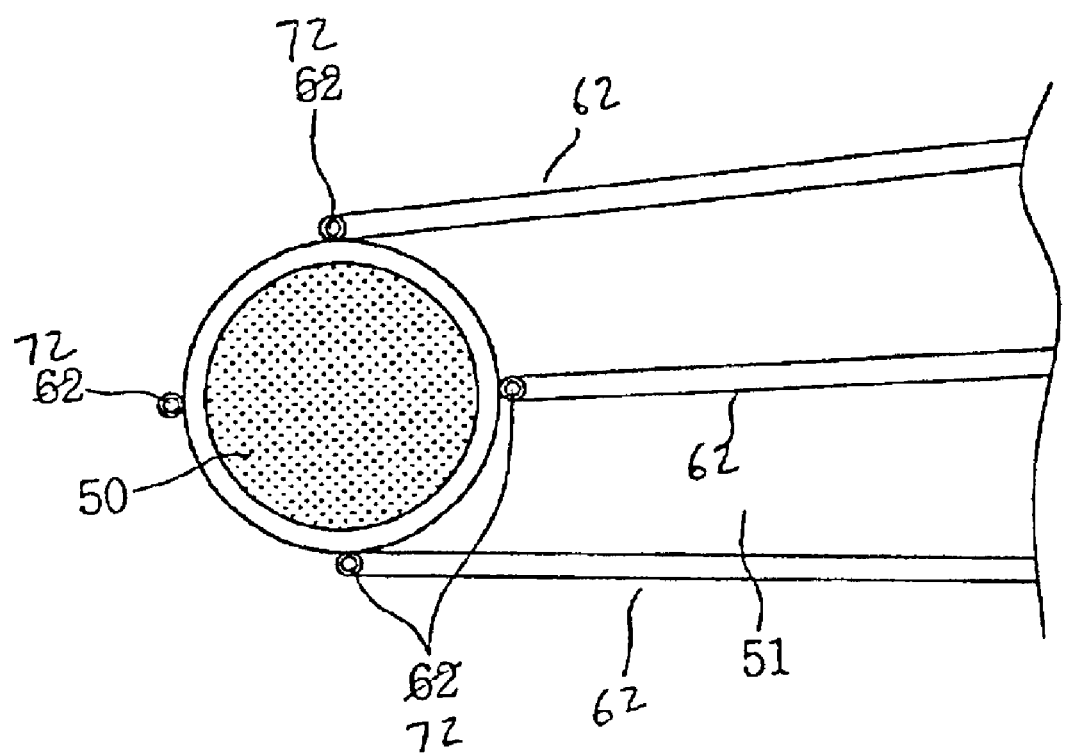
FIG. 5 is a bottom view showing the main portion of the second injector shown in FIGS. 2 through 4 according to a third preferred embodiment of the present invention.

Although only a single second injector 62 is disclosed in FIGS. 3 and 4, a plurality of second injectors 62 may be disposed along the brush arm 51 with corresponding nozzles positioned adjacent to the brush 50 and toward the wafer surface, as shown in FIG. 5. In this case, the plurality of the second injectors 62 are fixed to the brush 50 by a separate fixer and move together with the brush arm 50 to form the water screen on the wafer 10 during the scrubbing.

In the preferred embodiments, if the wafer 10 is of increased size, the amount of pure water ejected through the injectors 61, 62 accordingly may be increased, thereby raising the pressure of the ejected water. Similarly, if the rotational speed of the wafer 10 increases, the amount of ejected pure water also increases, thereby maintaining the thickness of the corresponding water screen.

The cleaning device according to a preferred embodiments of the present invention is operated when the turntable 20 is driven and the wafer 10, which adheres to the turntable 20, rotates accordingly. When the turntable 20 rotates, the first injector 61 ejects a set amount of pure water toward the center portion of the wafer 10 through the first nozzle 71 under a given pressure. Similarly, the second injector 62 disposed next to the brush 51 also ejects a given amount of pure water toward the wafer surface through the second nozzle 72, to form the uniform water screen on the wafer 10. In such a way, even if the brush 50 that is in contact with the wafer surface rotates and moves between the center and the edge of the wafer 10, the wafer surface is not damaged during brush scrubbing movement, because the wafer 10 is uniformly coated with pure water sprayed by the second injector 62.

Such a cleaning device according to a preferred embodiment of the present invention promotes more efficiency when working on a large wafer. A conventional cleaning device would require an increased number of injectors for a wafer of increased size. In contrast, a cleaning device according to the preferred embodiments of the present invention does not need additional injectors, because brush 50 can move over the wafer and eject pure water toward the wafer to form a uniform water screen on the wafer, even if the wafer size is large.

In particular, if the wafer is large, the conventional cleaning device requires a complicated structure having great precision, so that a number of injectors are correspondingly assembled. In contrast, the cleaning device according to the preferred embodiments of the present invention does not require such a complicated structure.

A conventional cleaning device could have a brush arm that has a water path therein in which water flows, and nozzles formed on the bottom of the brush. However, such a device cannot provide uniform water pressure because of interference between the water and the brush. As a result, the wafer surface could be damaged by the brush scrubbing movement. In contrast, the cleaning device according to the preferred embodiments of the present invention forms a uniform water screen on the wafer 10 through the second injector 62, prior to the scrubbing movement by the brush 50, so that the wafer is not damaged.

Thus, according to the present invention, since the injector for ejecting pure water to clean the wafer is disposed adjacent to the brush 50, it is easy to assemble the injectors. Furthermore, the injector can eject pure water in the moving direction of the brush 50 to form a uniform water screen on the wafer, thereby entirely removing the particles and raising the reliability in the process.

The present invention has been described by way of specific exemplary embodiments, and the many features and advantages of the present invention are apparent from the written description. Thus, it is intended that the appended claims cover all such features and advantages of the invention. Further, since numerous modifications and changes will readily occur to those skilled in the art, it is not desired to limit the invention to exact construction and operation as illustrated and described. Hence, all suitable modifications and equivalents should be considered as falling within the scope of the invention.

What is claimed is:

1. A cleaning device comprising:
   a pure water supply;
   first and second injectors that eject pure water supplied from the pure water supply onto a wafer;
   first and second nozzles attached to ends of the respective first and second injectors;
   a brush that cleans the wafer during a linear horizontal movement between a center and edges of the wafer; and
   a brush arm that supports and moves the brush,
   wherein the first injector is in a fixed position so as not to move together with the brush arm, and ejects the pure water at an upper position of the wafer toward the center of the wafer, and
   wherein the second injector is disposed adjacent to the brush along one side of the brush arm so as to move together with the brush arm, and supplies the pure water toward the wafer.

2. The cleaning device as recited in claim 1, wherein the second nozzle is disposed such that it is perpendicular to a top surface of the wafer that is in contact with the brush.

3. The cleaning device as recited in claim 1, wherein the first injector is arranged to be perpendicular to the second injector.

4. The cleaning device as recited in claim 3, wherein the brush arm moves in a direction parallel to linear orientation of the first injector.

5. The cleaning device as recited in claim 1, wherein the brush arm is movable in a vertical direction to keep the brush a desired distance from a surface of the wafer.

6. The cleaning device as recited in claim 1, wherein the brush arm is movable in a vertical direction to keep the brush in contact with a surface of the wafer.

7. The cleaning device as recited in claim 1, wherein the brush moves perpendicularly with respect to a direction along which the first injector extends.

8. The cleaning device of claim 1, where the first injector extends along a radial direction from an edge of the wafer toward the center of the wafer, and ejects the pure water onto a central portion of the wafer.

9. A cleaning device comprising:
   a pure water supply;
   first injector that ejects pure water supplied from the pure water supply onto a central portion of the wafer;
   a plurality of second injectors that eject pure water supplied from the pure water supply onto the wafer;
   a first nozzle attached to the first injector;
   a plurality of second nozzles respectively attached to the second injectors;
   a brush that cleans the wafer during horizontal movement between a center and edges of the wafer, while the pure water is ejected by the first and second nozzles; and
   a brush arm that supports and moves the brush,
   wherein the plurality of second injectors comprise a plurality of pipe lines formed along a circumference of the brush arm, the end of the pipelines facing a top surface of the wafer.

10. The cleaning device as recited in claim 9, wherein the plurality of second injectors are tightly fixed to the brush arm by a fixing apparatus.

11. The cleaning device as recited in claim 9, wherein the first injector is arranged to be perpendicular to the plurality of second injectors.

12. The cleaning device as recited in claim 11, wherein the brush arm moves in a direction parallel to a linear orientation of the first injector.

13. The cleaning device as recited in claim 9, wherein the brush arm is movable in a vertical direction to keep the brush a desired distance from a surface of the wafer.

14. The cleaning device as recited in claim 9, wherein the brush arm is movable in a vertical direction to keep the brush in contact with a surface of the wafer.

15. The cleaning device of claim 9, where the first injector extends along a radial direction from an edge of the wafer toward the center of the wafer, and ejects the pure water onto a central portion of the wafer.

* * * * *